United States Patent [19]
Mack et al.

[11] Patent Number: 5,906,861
[45] Date of Patent: May 25, 1999

[54] APPARATUS AND METHOD FOR DEPOSITING BOROPHOSPHOSILICATE GLASS ON A SUBSTRATE

[75] Inventors: Brian Mack, Poway; Warren Mc Arthur, Solana Beach, both of Calif.

[73] Assignee: Raytheon Company, Lexington, Mass.

[21] Appl. No.: 08/094,794

[22] Filed: Jul. 20, 1993

[51] Int. Cl.$^6$ .................................................. C23C 16/00
[52] U.S. Cl. ........................ 427/255.3; 427/563; 427/564; 427/562; 427/567
[58] Field of Search .................................. 427/562, 563, 427/564, 567, 255.3

[56] References Cited

U.S. PATENT DOCUMENTS

| | | | |
|---|---|---|---|
| 3,481,781 | 12/1969 | Kern | 117/215 |
| 4,105,810 | 8/1978 | Yamazaki et al. | 427/248 |
| 4,546,016 | 10/1985 | Kern | 427/255.3 |
| 4,557,950 | 12/1985 | Foster et al. | 427/255 |
| 4,791,005 | 12/1988 | Becker et al. | 427/255.3 |
| 4,801,468 | 1/1989 | Ishihara et al. | 427/562 |
| 4,952,524 | 8/1990 | Lee et al. | 437/67 |
| 5,028,566 | 7/1991 | Lagendijk | 437/238 |
| 5,093,149 | 3/1992 | Doehler et al. | 427/563 |

FOREIGN PATENT DOCUMENTS 0 204 182   5/1986   European Pat. Off. .

OTHER PUBLICATIONS

*Materials Research Society Symposium Proceedings*, O'Meara et al., "The deposition of borophosphosilicate glass films by LPCVD using 2, 4, 6, 8 tetramethylcyclotetrasiloxane", Nov. 26–28, 1990, vol. 204, 1991, pp. 533–538, Boston MA.

*Extended Abstracts*, Becker et al. "TEOS–Borophosphosilicate glass (BPSG) and borosilicate glass (BSG) for trench applications", vol. 86, No. 2, pp. 394–395, Oct. 1986, Princeton NJ.

*Journal of Vacuum Science and Technology*: Part B.,Becker et al. "Process and film characterization of low pressure tetraethy lorthosilicate–borophosphosilicate glass", Jun. 1986, vol. 4, No. 3, pp. 732–744, New York NY.

*Journal of the Electrochemical Society*, Levy et al. "A new LPCVD technique of producing borophosphosilicate glass films by injection of miscible liquid precursors", vol. 134, No. 2, Feb. 1987, pp. 430–437, Manchester NH.

*Microelectronic Manufacturing and Testing*. Ferran et al., "Delivering low–vapor pressure materials to LPCVD processes", vol. 11, No. 10, pp. 26–29, Sep. 1988, U.S.A.

Hochberg, Dr. A., and Dr. B. Gelernt, User's Guide For: Undoped Glass, PSG, and BPSG Using TOMCATS® Source Material*, No Month Available 1991, Schumacher, Carlsbad, California 92009, 18 pages.

*Primary Examiner*—Brian K. Talbot
*Attorney, Agent, or Firm*—W. C. Schubert; G. H. Lenzen, Jr.

[57] ABSTRACT

A borophosphosilicate glass is deposited on a substrate (50) by heating the substrate (50), and contacting the substrate with a mixture of the gases tetramethylcyclotetrasiloxane, trimethylborate, trimethylphosphite, and oxygen, without the presence of a carrier gas. The first three of the gases are produced from liquid sources by controlled vaporization and flow. The gases react at the heated substrate (50) to deposit the glass upon the substrate. In a reactor (52) for depositing the glass, the tetramethylcyclotetrasiloxane and trimethylborate are introduced at a gas inlet location (79), and the trimethylphosphite and oxygen are heated and introduced at another gas inlet location (90). The tetramethylcyclotetrasiloxane and trimethylborate mixture flows toward the location where the trimethylphosphite and oxygen are introduced, and whereat the gases are mixed. This gaseous mixture flows past the heated substrate (50) to deposit the glass thereon.

16 Claims, 3 Drawing Sheets

APPARATUS AND METHOD FOR DEPOSITING BOROPHOSPHOSILICATE GLASS ON A SUBSTRATE

BACKGROUND OF THE INVENTION

This invention relates to the preparation of substrates coated by borophosphosilicate glasses, and, more particularly, to a methodology for preparing such coated substrates using chemical vapor deposition.

Borophosphosilicate glass is a dielectric material that is used in microelectronic devices as a separating layer between two electrical conductors. The glass is deposited as a film over an existing layered structure of conductors, semiconductors, and insulators, and further layers are deposited over the glass. The various layers are patterned as required to produce the electronic traces and circuit elements of the microelectronic device. The borophosphosilicate glass can be reflowed (fused) after deposition to change the configuration of the glass film.

One preferred approach to depositing a film of borophosphosilicate glass is by chemical vapor deposition. The various constituents of the glass are provided in properly selected, chemically reactive, gaseous compounds. The compounds are mixed and passed as a gas flow through a reactor and over the substrate upon which the glass is to be deposited. The substrate is heated or otherwise energized. When the gaseous compounds contact the surface of the heated substrate, they react with each other to form a borophosphosilicate glass on the surface.

Some or all of the reactive compounds used to form the gas may be first provided as liquids. Gas vapors of the liquids are produced either by applying heat to vaporize the liquids, or by bubbling a carrier gas through the liquid. The gas vapors are mixed and provided to the reactor.

In one commercial approach to depositing borophosphosilicate glass by chemical vapor deposition, tetraethylorthosilicate (having a formula $Si(C_2H_5O)_4$), trimethylborate, and trimethylphosphite gases, mixed with carrier gases, are reacted together at the heated substrate surface to form the glass film. The tetraethylorthosilicate is a relatively toxic, hazardous material. Its handling and disposal present major problems for the user. A large, complex, expensive apparatus is required for gas handling, reaction, control, and disposal. Very tight process controls are required to achieve good-quality films of the glass, and the throughput of product can be slow. Moreover, the films produced by this conventional approach may have marginal electrical properties and conformality.

In an another approach, it has been proposed to deposit the borophosphosilicate glass from a gaseous mixture of tetramethylcyclotetrasiloxane, trimethylborate, trimethylphosphite, and oxygen. This approach has not been commercially successful due to the deposition of impurities onto the substrates and low deposition efficiencies.

There is a need for an improved approach to the production of borophosphosilicate glass films for microelectronic and other applications. The present invention fulfills this need, and further provides related advantages.

SUMMARY OF THE INVENTION

The present invention provides a method and apparatus for depositing films of borophosphosilicate glass by chemical vapor deposition. Relatively safe sources of the reactants are used. The apparatus is comparatively inexpensive. The apparatus permits the desired composition of the glass to be deposited precisely, but the maintaining of tight operating controls is not required. The throughput of the apparatus and yields of the films are therefore good. The quality of the deposited borophosphosilicate glass films is superior to that obtained by prior techniques, in regard to surface smoothness, conformality, and electrical properties.

In accordance with a processing aspect of the invention, a process for depositing a borophosphosilicate glass on a substrate comprises the steps of providing a substrate at a first location within a reactor, applying energy to the substrate, and supplying sources of the gases tetramethylcyclotetrasiloxane, trimethylborate, trimethylphosphite, and oxygen. The method further includes mixing the tetramethylcyclotetrasiloxane and the trimethylborate together to form a first gaseous mixture, introducing the first gaseous mixture into the reactor at a second location remote from the substrate, mixing the trimethylphosphite and the oxygen together to form a second gaseous mixture and preheating the second gaseous mixture, and introducing the second gaseous mixture into the reactor at a third location between the first location and the second location. The first gaseous mixture and the second gaseous mixture mix together to form a third gaseous mixture which thereafter flows past the substrate.

An apparatus for practicing the invention includes a reactor, a substrate support at a first location within the reactor, a source of energy for the interior of the reactor, and sources of the gases tetramethylcyclotetrasiloxane, trimethylborate, trimethylphosphite, and oxygen. There is a first gas inlet to the reactor at a second location, the first gas inlet being in communication with the source of tetramethylcyclotetrasiloxane and the source of trimethylborate, and a second gas inlet to the reactor at a third location between the first location and the second location, the second gas inlet being in communication with the source of trimethylphosphite and the source of oxygen. The apparatus further includes means for causing gases to flow in the direction from the second location toward the first location.

In both the method and the apparatus, it is desirable to provide flows of at least about 12 parts by volume per minute of the tetramethylcyclotetrasiloxane, at least about 20 parts by volume per minute of the trimethylborate, at least about 5 parts by volume per minute of the trimethylphosphite, and at least about 400 parts by volume per minute of oxygen. In both the method and the apparatus, the substrate is preferably energized by heating the substrate to from about 500C to about 650C.

It is preferred to separately mix the tetramethylcyclotetrasiloxane and trimethylborate gases together, and the trimethylphosphite and oxygen gases together. The mixture of tetramethylcyclotetrasiloxane and trimethylborate gases is injected into the reactor at a location remote from the substrate. A pressure gradient within the reactor causes the mixture to flow toward the heated substrate. Separately, the trimethylphosphite and oxygen gases are mixed together, heated, and added to the flow of the mixture of tetramethylcyclotetrasiloxane and trimethylborate gases. After passing the substrate, the gases are cleaned and exhausted.

A thin borophosphosilicate glass film produced by the approach of the invention has a surface smoothness after reflow superior to that obtained by prior chemical vapor deposition processes. Its glass transition temperature is lower than the conventional material. The electrical properties and conformality of the film are also superior. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
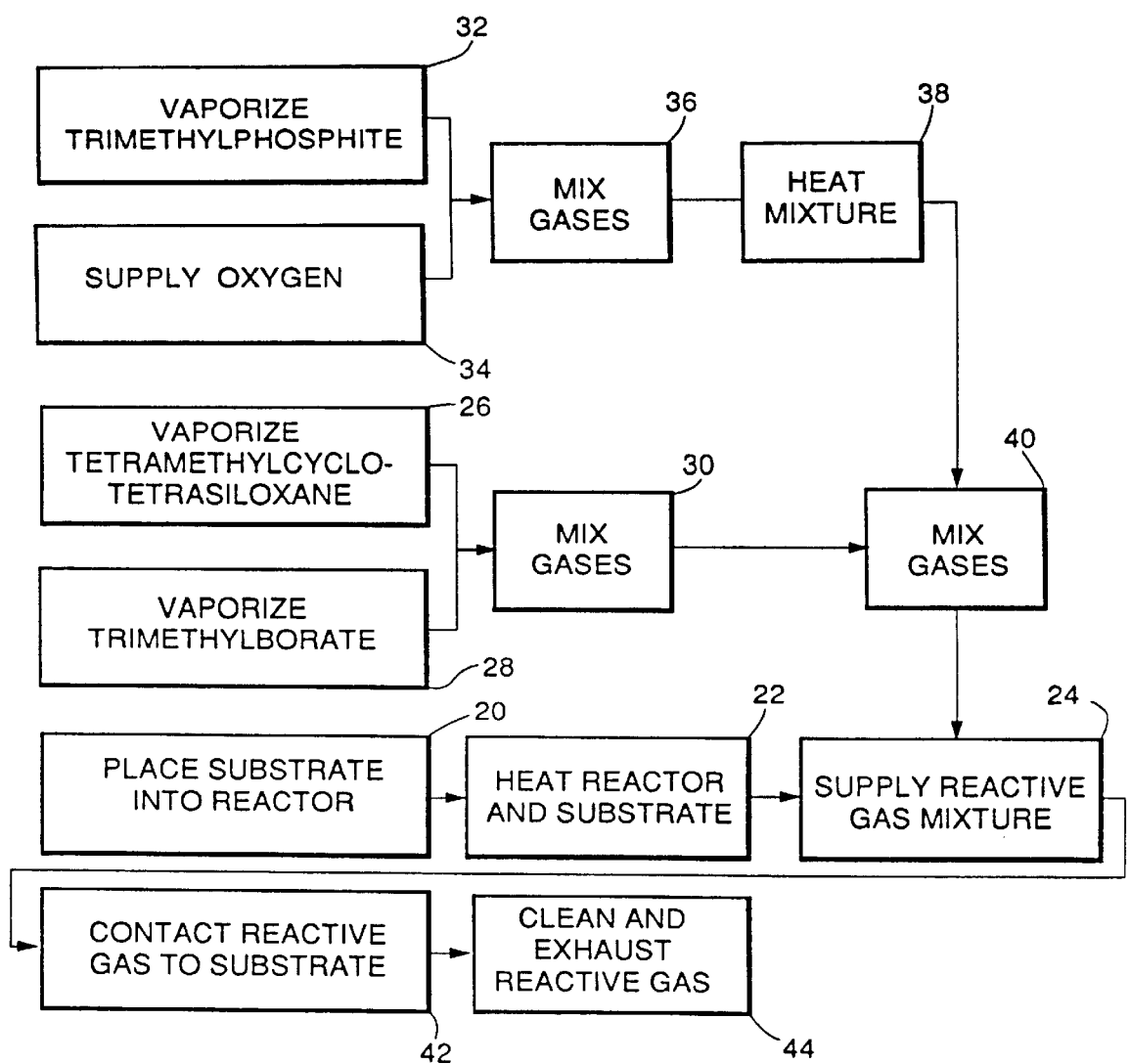
FIG. 1 is a process flow chart for the preferred approach of the invention.
Figure 2:
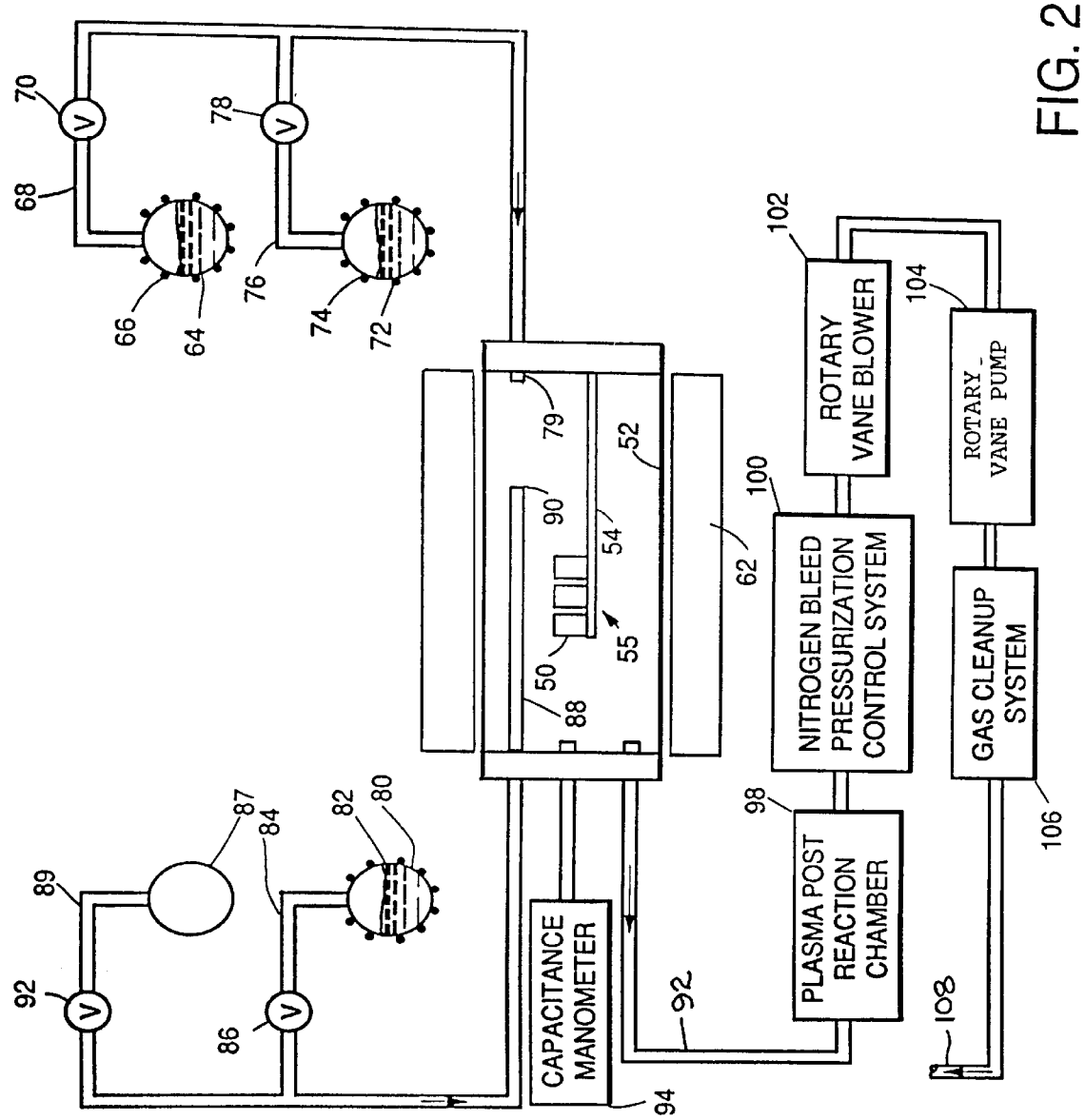
FIG. 2 is a schematic diagram of an apparatus for practicing the invention.
Figure 3:
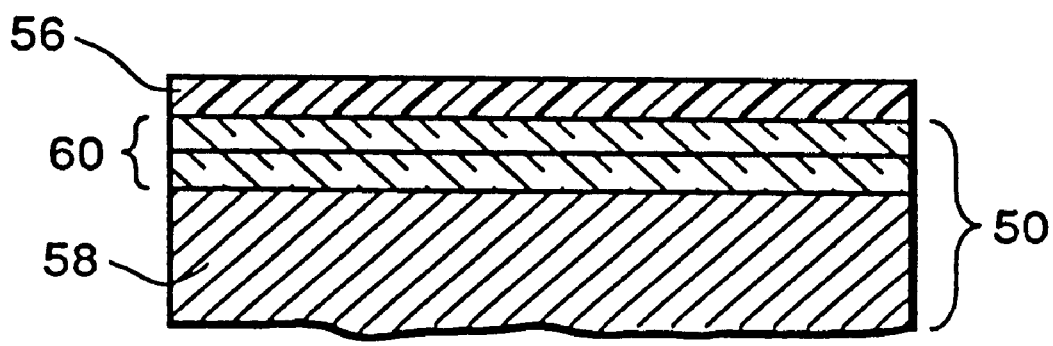
FIG. 3 is a sectional view of a film of the glass deposited upon a substrate.

FIG. 1 depicts a preferred method for practicing the invention, and FIG. 2 shows a corresponding apparatus. The following discussion will refer to these interrelated method and apparatus. The invention is not so limited, however, and the method of the invention can be practiced with other apparatus. For example, the method can be practiced in a closed container rather than an open flow system. FIG. 3 depicts the product produced by the method and apparatus of FIGS. 1 and 2, respectively.

In a first step, numeral 20, a substrate 50 is placed into a horizontal quartz tube 52 that serves as a reactor. The quartz tube 52 preferably is about 176 millimeters in diameter. The process operates less efficiently when the quartz tube has a diameter of less than about 170 millimeters. The substrate 50 is preferably supported on a support 54 at a first location 55, with the normal to the face upon which deposition is occurring lying parallel to a major axis of the tube 52. (In a typical case, the major axis is horizontal, so that the substrate is oriented vertically and the normal to the face of the substrate horizontally. The major axis may alternatively be vertical.) The substrate 50 is a structure upon which a film 56 of borophosphosilicate glass is to be deposited, see FIG. 3. The borophosphosilicate glass has a typical composition of about 3 to about 10 (preferably about 4–5) weight percent boron, about 2 to about 7 (preferably about 3–4) weight percent phosphorus, balance $SiO_2$. In a typical case the substrate 50 includes a base 58 with previously deposited layers 60 thereupon. The film 56 is deposited overlying the exposed face of the substrate 50, in this case the uppermost of the layers 60.

The tube 52 and the substrate 50 are heated, numeral 22, to a reaction temperature by placing a furnace 62 around the tube 52. The preferred reaction temperature is from about 500C to about 650C. A most preferred reaction temperature is from about 560 to about 565C. The principal purpose of heating the substrate is to provide the proper energetic conditions for the deposition reaction. This energy can be supplied by alternative techniques, such as, for example, a plasma.

A reactive gas mixture is supplied, numeral 24. The borophosphosilicate glass film 56 is deposited as a result of the reaction of these gases once they are mixed. To minimize the likelihood of premature deposition, the gases are mixed in stages.

Tetramethylcyclotetrasiloxane, having a chemical formula of $C_4H_{16}Si_4O_4$, is provided as a liquid in a container 64 having a temperature control system 66. (Tetramethylcyclotetrasiloxane is also sometimes known in the art as 2,4,6,8-tetramethylcyclotetrasiloxane or TMCTS.) The temperature control system 66 may include both a heater and cooling coils, as needed, to maintain the temperature of the liquid in the container 64 at a preselected temperature. The temperature of the container 64 is at least about 25C, and preferably from about 25C to about 70C. At this temperature, the liquid continually vaporizes, numeral 26. The tetramethylcyclotetrasiloxane vapor evolved from the liquid is collected in a conduit 68 and passed through a valve 70 that regulates the flow rate of the vapor. The flow rate is at least about 12 parts by volume per minute, and preferably from about 12 to about 25 parts by volume per minute. (The flow rates of all gases are expressed herein in "parts by volume per minute", as a standard basis for comparison of the relative flows. The "parts" could be standard cubic centimeters, a multiple thereof, or other volume measure.)

Trimethylborate $[B(OCH_3)_3]$ liquid is provided in a container 72 having a temperature control system 74. The temperature control system 74 may include both a heater and cooling coils, as needed, to maintain the temperature of the liquid in the container 72 at a preselected temperature. The temperature of the container 72 is at least about 15C, and preferably from about 15C to about 70C. At this temperature, the liquid continually vaporizes, numeral 28. The trimethylborate vapor evolved from the liquid is collected in a conduit 76 and passed through a valve 78 that regulates the flow rate of the vapor. The flow rate is at least about 20 parts by volume per minute, and preferably from about 20 to about 65 parts by volume per minute.

The tetramethylcyclotetrasiloxane vapor and the trimethylborate vapor are mixed together, numeral 30, to form a first gaseous mixture. This first gaseous mixture is injected into the reactor at one end of the quartz tube 52 through an injector tube whose end is positioned at a second location 79 near one end of the quartz tube 52.

Separately, trimethylphosphite $[P(OCH_3)_3]$ liquid is provided in a container 80 having a temperature control system 82. The temperature control system 82 may include both a heater and cooling coils, as needed, to maintain the temperature of the liquid in the container 80 at a preselected temperature. The temperature of the container 80 is at least about 20C, and preferably from about 20C to about 70C. At this temperature, the liquid continually vaporizes, numeral 32. The trimethylborate vapor evolved from the liquid is collected in a conduit 84 and passed through a valve 86 that regulates the flow rate of the vapor. The flow rate is at least about 5 parts by volume per minute, and preferably from about 5 to about 20 parts by volume per minute.

Oxygen gas is supplied, numeral 34, preferably from a bottle 87 of pressurized pure oxygen gas at ambient temperature. The oxygen gas passes through a conduit 89 and a valve 92 that regulates the pressure and flow rate of the oxygen. The flow rate is at least about 400 parts by volume per minute, and is preferably from about 400 to about 1500 parts by volume per minute.

The trimethylphosphite gas and the oxygen are mixed together, numeral 36, to form a second gaseous mixture. The second gaseous mixture is heated, numeral 38, preferably to about the temperature of the substrate 50. The heating is readily accomplished by passing the mixture of trimethylphosphite gas and oxygen through a gas tube 88 that extends from one end of the quartz tube 52 and along the interior of the quartz tube 52. The mixture is thereby heated to the temperature of the substrate as it passes through the tube 88. A second gas tube can also be provided running in parallel with the illustrated gas tube 88 to conduct the second gas mixture, so achieve an even distribution and to ensure that the pressure drop in the tubes is sufficiently low that the gas sources are not adversely affected. The end of the gas tube 88 is at a third location 90 within the quartz tube 52 and between the first location 55 and the second location 79.

A gas flow is created in the interior of the quartz tube 52 in a direction from the second location 79 toward the first location 55. The first gaseous mixture injected at the second location 79 mixes with the second gaseous mixture injected at the third location 90, numeral 40, to form a third gaseous mixture. It is this third gaseous mixture, numeral 40, that is supplied as the reactive gas mixture, numeral 24, and which flows past the substrate 50 and contacts the substrate, numeral 42. In a preferred reactor design, there is a spacing of about 20 inches between the second location and the third location, and a further spacing of at least about 10 inches between the third location and the first location. These spacings permit the gas flows to become regular, and for the mixtures to mix well before contacting the substrate.

This mode of mixing and providing the reactive gas is important to the proper functioning of the deposition method and apparatus. In a prior approach, the tetramethylcyclotetrasiloxane vapor and the trimethylborate vapor were injected immediately adjacent to the substrate, and the trimethylphosphite gas and the oxygen were injected at about the same location. It has been found by the present inventors that, with this approach, the tetramethylcyclotetrasiloxane tends to prematurely decompose to produce oxygen and a silicon-containing material that deposits upon the substrate as an impurity. The result was a low efficiency that required a high flow rate of the relatively expensive tetramethylcyclotetrasiloxane, and, more importantly, produced unacceptably contaminated substrates. The present approach overcomes these problems and results in both high process efficiency and an uncontaminated substrate.

The liquid sources of the reactive gases are stable and not dangerous. The reactive gases are of relatively low toxicity, and can be reacted and cleaned to eliminate the potential for environmental damage upon release. The reactants form organic compound reaction products, and the TLV levels are extremely low.

Another important feature of the present invention is that the gas mixture contains no contaminants introduced from other sources. For example, it is common practice to entrain the reactive gases into an inert carrier gas such as argon, nitrogen, and the like. Regardless of the efforts to purify the carrier gas, there are typically small amounts of impurities in the carrier gas. The present selection of the reactive gases permits the reactive gases to be vaporized and conducted to the reactor without the use of any carrier gas that could potentially introduce contaminants into the deposited glass film 56.

The portion of the gas mixture that does not react and deposit upon the substrate 50 leaves the quartz tube 52 through an exit line 92 at an opposite end of the quartz tube 52 from the second location 79 to be cleaned and exhausted, numeral 44. The pressure in the quartz tube 52 is measured by a pressure gauge, preferably a capacitance manometer 94. The total gas pressure in the exit line 92 and the interior of the quartz tube 52 is preferably from about 0.400 to about 0.850 torr.

Any remaining reaction product in the gases is removed in a plasma post reaction chamber 98. Such a post reaction device is available commercially from Dry Electrochemical Technology, as the "Dry Scrub" system.

The exiting gas flow rate, and thence the pressure in the quartz tube 52, is controlled by a nitrogen bleed pressurization control system 100. The greater the flow rate through the pressure control system 100, the lower is the pressure in the quartz tube 52, assuming a constant flow rate of gas into the quartz tube 52.

A rotary vane blower 102 and a rotary vane pump 104 combine to draw the gas flow from the quartz tube 52 toward an exhaust 108. The blower 102 and dry pump 104 thus create the gas flow in the direction from the second location 79 toward the first location 55 by biasing the pressure in the quartz tube 52 to be lower at the first location 55 than the second location 79. A gas cleanup system 106, such as a scrubber, is provided where necessary to meet gas discharge restrictions.

Figure 4:
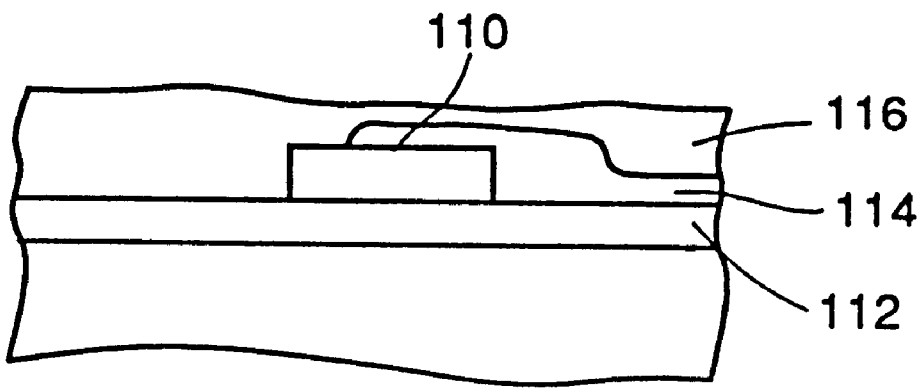
FIG. 4 is an elevational view of an insulating layer of the glass overlying a microelectronic structure.

FIG. 4 shows a typical preferred utilization of the present invention. A layer 110 of epitaxial silicon is deposited upon a substrate layer 112 of silicon or sapphire and patterned. A layer 114 of polysilicon is deposited overlying the layer 110 and the layer 112 and patterned. A layer 116 of the borophosphosilicate glass is deposited overlying the layers 110, 112, and 114 according to the methods and in the apparatus discussed previously, and reflowed to produce the depicted structure.

An apparatus like that of FIG. 2 has been constructed at a cost of about ¼ that of conventional chemical vapor deposition apparatus previously used to deposit borophosphosilicate glass. The process of FIG. 1 was practiced using that apparatus. The following results were obtained. These examples should be interpreted as illustrative of aspects of the invention, and should not be taken as limiting of the invention in any respect.

EXAMPLE 1

The method depicted in FIG. 1, and discussed previously, and the apparatus depicted in FIG. 2, and discussed previously, were used to prepare coated articles of the type shown in FIG. 3. The base layer substrate was p-type silicon. Deposition was accomplished at a temperature of about 565C and a total pressure of 0.600 torr. Prior to the deposition of the borophosphosilicate glass, a layer of undoped $SiO_2$ about 1000 A thick was deposited from a gas flow mixture of 16 sccm (standard cubic centimeters per minute) of tetramethylcyclotetrasiloxane and 400 sccm oxygen. Deposition of the $SiO_2$ was at a rate of about 41 A per minute. After the deposition of the undoped $SiO_2$ was complete, a layer of borophosphosilicate glass was deposited from a gas flow mixture of 16 sccm tetramethylcyclotetrasiloxane, 47 sccm trimethylborate, 8 sccm trimethylphosphite, and 1000 sccm oxygen. The deposition rate of the borophosphosilicate glass was about 95 A per minute. The borophosphosilicate glass had about 5 weight percent boron, 3 weight percent phosphorus, balance $SiO_2$.

EXAMPLE 2

The reflow and conformality properties of the coated specimens were determined by depositing a 0.6 micrometer coating of borophosphosilicate glass over isolated 0.4 micrometer steps. The resulting structures were studied by scanning electron microscopy. Film flow angles of 50 to 70 degrees were determined.

EXAMPLE 3

The electrical breakdown voltage of the undoped $SiO_2$ in the specimens of Example 1 was measured to be 5.7 megavolts per centimeter. The electrical breakdown voltage of the borophosphosilicate glass was measured to be 8.2 megavolts per centimeter.

The present invention provides a method and apparatus for depositing borophosphosilicate glass at a high deposition rate of typically about 95 Angstroms per minute. The conformality is better than that achieved using tetraethylorthosilicate as the primary source. The carbon content of the films is less than about 1.8 parts per million, the detection limit in SIMS analysis. The stress in the deposited glass is low, and there is a shrinkage of less than about 5 percent after densification or reflow.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for depositing a borophosphosilicate glass on a substrate, comprising the steps of:

providing a substrate at a first location within a reactor;

applying energy to the substrate;

supplying sources of the gases tetramethylcyclotetrasiloxane, trimethylborate, trimethylphosphite, and oxygen;

mixing the tetramethylcyclotetrasiloxane and the trimethylborate together to form a first gaseous mixture;

introducing the first gaseous mixture into the reactor at a second location remote from the substrate;

mixing the trimethylphosphite and the oxygen together to form a second gaseous mixture and heating the second gaseous mixture;

introducing the second gaseous mixture into the reactor at a third location between the first location and the second location; and causing the first gaseous mixture and the second gaseous mixture to mix together to form a third mixture which thereafter flows past the substrate.

2. The process of claim 1, wherein the step of applying energy includes the step of heating the substrate to a temperature of from about 500C to about 650C.

3. The process of claim 1, wherein the step of causing includes the step of establishing the total pressure of the gaseous mixture at from about 0.400 torr to about 0.850 torr.

4. The process of claim 1, wherein the step of supplying sources of the gases includes the steps of heating a liquid source of tetramethylcyclotetrasiloxane to a temperature of at least about 25C, heating a liquid source of trimethylborate to a temperature of at least about 15C, and heating a liquid source of trimethylphosphite to a temperature of at least about 20C.

5. The process of claim 1, wherein the step of supplying sources of the gases includes the steps of providing at least about 12 parts by volume per minute of the tetramethylcyclotetrasiloxane, providing at least about 20 parts by volume per minute of the trimethylborate, providing at least about 5 parts by volume per minute of the trimethylphosphite, and providing at least about 400 parts by volume per minute of oxygen.

6. A process for depositing a borophosphosilicate glass on a substrate, comprising the steps of:

supplying an energized substrate;

supplying sources of the gases tetramethylcyclotetrasiloxane, trimethylborate, trimethylphosphite, and oxygen;

mixing the tetramethylcyclotetrasiloxane and the trimethylborate together to form a first gaseous mixture;

mixing the trimethylphosphite and the oxygen together to form a second gaseous mixture and heating the second gaseous mixture;

introducing the first gaseous mixture into the reactor and the second gaseous mixture into the reactor at different locations remote from the substrate; and causing the first gaseous mixture and the second gaseous mixture to mix together and to flow past the energized substrate.

7. The process of claim 6, wherein the step of causing includes the step of heating the substrate to a temperature of from about 500C to about 650C.

8. The process of claim 6, wherein the step of causing includes the step of establishing the total pressure of the gaseous mixture at from about 0.400 torr to about 0.850 torr.

9. The process of claim 6, wherein the step of supplying sources of the gases includes the steps of heating a liquid source of tetramethylcyclotetrasiloxane to a temperature of at least about 25C, heating a liquid source of trimethylborate to a temperature of at least about 15C, and heating a liquid source of trimethylphosphite to a temperature of at least about 20C.

10. The process of claim 6, wherein the step of supplying sources of the gases includes the steps of providing at least about 12 parts by volume per minute of the tetramethylcyclotetrasiloxane, providing at least about 20 parts by volume per minute of the trimethylborate, providing at least about 5 parts by volume per minute of the trimethylphosphite, and providing at least about 400 parts by volume per minute of oxygen.

11. The process of claim 1, wherein the step of causing is accomplished without introducing a carrier gas into the reactor.

12. The process of claim 6, wherein the step of causing is accomplished without introducing a carrier gas into the reactor.

13. The process of claim 1, wherein the step of providing a substrate includes the step of providing a silicon substrate.

14. The process of claim 6, wherein the step of supplying an energized substrate includes the step of providing a silicon substrate.

15. The process of claim 1, including an additional step, after the step of causing, of reflowing a glass layer formed on the substrate during the step of causing.

16. The process of claim 6, including an additional step, after the step of causing, of reflowing a glass layer formed on the substrate during the step of causing.

* * * * *